United States Patent
Won et al.

(10) Patent No.: US 7,442,982 B2
(45) Date of Patent: Oct. 28, 2008

(54) CAPACITOR HAVING REACTION PREVENTING LAYER AND METHODS OF FORMING THE SAME

(75) Inventors: Seok-Jun Won, Seoul (KR); Dae-Jin Kwon, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 267 days.

(21) Appl. No.: 11/130,647

(22) Filed: May 17, 2005

(65) Prior Publication Data

US 2006/0079065 A1   Apr. 13, 2006

(30) Foreign Application Priority Data

Oct. 11, 2004   (KR) .................. 10-2004-0080998

(51) Int. Cl.
*H01L 29/08* (2006.01)
*H01L 29/94* (2006.01)

(52) U.S. Cl. ..................... 257/306; 257/310; 257/40

(58) Field of Classification Search ................. None
See application file for complete search history.

(56) References Cited

U.S. PATENT DOCUMENTS

| | | | |
|---|---|---|---|
| 5,576,579 A | 11/1996 | Agnello et al. | |
| 5,776,823 A | 7/1998 | Agnello et al. | |
| 5,796,166 A | 8/1998 | Agnello et al. | |
| 6,479,364 B2 | 11/2002 | Shin et al. | |
| 2001/0036708 A1 | 11/2001 | Shin et al. | |
| 2005/0012089 A1* | 1/2005 | Senzaki et al. | 257/40 |
| 2005/0141168 A1* | 6/2005 | Lee et al. | 361/306.3 |
| 2005/0167723 A1* | 8/2005 | Forbes et al. | 257/306 |

FOREIGN PATENT DOCUMENTS

| | | |
|---|---|---|
| JP | 08236479 | 9/1996 |
| KR | 1997-0053963 | 7/1997 |
| KR | 10-2001-0039874 | 5/2001 |
| KR | 10-2001-0045566 | 6/2001 |
| KR | 20010056976 | 7/2001 |
| KR | 20010059285 | 7/2001 |
| KR | 10-2002-0013189 | 2/2002 |
| KR | 20030003322 | 1/2003 |

* cited by examiner

*Primary Examiner*—Zandra Smith
*Assistant Examiner*—Pamela E Perkins
(74) *Attorney, Agent, or Firm*—Mills & Onello LLP

(57) ABSTRACT

The present invention is directed to a capacitor having a reaction preventing layer and a method forming the same. A lower electrode of silicon is formed on a substrate. An assistance layer of metal oxide or metal nitride is formed on the lower electrode. A nitridation process is performed to enable the silicon of the lower electrode, the assistance layer, and nitrogen supplied by the nitridation process to react with one another, forming a reaction preventing layer comprising metal silicon oxynitride or metal silicon nitride. A high-k dielectric film and an upper electrode are formed on the reaction preventing layer.

13 Claims, 2 Drawing Sheets

CAPACITOR HAVING REACTION PREVENTING LAYER AND METHODS OF FORMING THE SAME

PRIORITY STATEMENT

This application claims priority to Korean Patent Application No. 2004-80998, filed on Oct. 11, 2004 in the Korean Intellectual Property Office, the disclosure of which is incorporated herein in its entirety by reference.

BACKGROUND OF THE INVENTION

1. Field of the Invention

The present invention relates to a semiconductor device and a method of forming the same. More specifically, the present invention is directed to a capacitor having a reaction preventing layer and methods of forming the same.

2. Description of Related Art

Capacitors enjoy widespread use in various semiconductor device applications, due to their charge-storing capabilities. Representative semiconductor devices that employ capacitors are DRAM devices. A unit cell of a DRAM device uses a capacitor as a data storage element. With the continued trend toward more highly integrated semiconductor devices, much effort has been applied to increasing the capacitance of a capacitor within a limited area.

A typical approach for increasing the capacitance of a capacitor is to increase an overlap area of both electrodes of a capacitor within a limited area. Therefore, very tall cylindrical lower electrodes have been suggested. However, as semiconductor devices become increasingly scaled down, methods for increasing the height of a cylindrical lower electrode result in the introduction of many problems, for example, inclination of the lower electrode or a high step difference between a peripheral circuit area and a cell area.

Another method for increasing the capacitance of a capacitor is to form a higher-k dielectric film as the dielectric substance of a capacitor. The higher the dielectric constant of the dielectric substance, the more the capacitance of the resulting capacitor increases. Unfortunately, a capacitor having a high-k dielectric film may encounter certain limitations. That is, a lower electrode made of polysilicon may become oxidized. If the lower electrode of polysilicon is oxidized, a silicon oxide layer of a low-k dielectric constant may be formed, which can result in a decrease in capacitance. Since a silicon oxide layer is vulnerable to leakage current, the leakage current characteristics of a capacitor may be degraded. For this reason, a technique for forming a reaction preventing layer between a lower electrode and a high-k dielectric film has been suggested for preventing reaction therebetween.

A reaction preventing layer comprising nitride is disclosed in Korean Patent Application No. 2002-13189. According to Korean Patent Application No. 2002-13189, a nitride layer is formed on a lower electrode using atomic layer deposition (ALD) to prevent a reaction from occurring between an applied dielectric film and the lower electrode. The nitride layer comprises, for example, aluminum silicon nitride (AlSiN).

However, if an aluminum silicon nitride layer is formed using ALD, characteristics of a capacitor may be degraded. Conventionally, ALD is carried out at a low temperature of 300-500 degrees centigrade. In this regard, source gases for forming an aluminum silicon nitride layer must have a sufficient reactivity at the low temperature. But it is uncommon for silicon source gases to have sufficient reactivity at low temperature.

In one approach, the use of a catalyst was suggested as a way to enable silicon source gases to have sufficient reactivity at low temperature. In this approach, a silicon precursor of halogen silicon compound and a catalyst such as amine are introduced into a chamber to secure a silicon source having sufficient reactivity. However, byproducts of the amine catalyst, particularly, carbon substance in the amine, may come to reside in the aluminum silicon nitride layer, which can degrade layer characteristics. As a result, leakage current of the resulting capacitor may increase. This, in turn, can result in degradation of various electrical properties of the resulting capacitor.

SUMMARY OF THE INVENTION

A feature of the present invention is to provide a semiconductor device capacitor in which characteristic degradation of a reaction preventing layer is suppressed, and a method of forming such a capacitor.

Another feature of the present invention is to provide a semiconductor device capacitor in which leakage current is suppressed, and a method of forming such a capacitor.

In order to achieve these features, in one aspect the present invention is directed to a method of forming a capacitor. According to the method, a lower electrode of silicon is formed on a substrate. An assistance layer is formed on the lower electrode. The assistance layer comprises metal oxide or metal nitride. A nitridation process is performed to enable silicon of the lower electrode, the assistance layer, and nitrogen supplied by the nitridation process to react with one another to form a reaction preventing layer. The reaction preventing layer comprises metal silicon oxynitride or meal silicon nitride. A high-k dielectric film is formed on the reaction preventing layer. An upper electrode is formed on the high-k dielectric film to cover the lower electrode.

In one embodiment, prior to formation of the assistance layer, a surface nitridation treatment may be performed on an upper surface of the lower electrode. In another embodiment, the assistance layer comprises aluminum oxide or aluminum nitride, so that the reaction preventing layer comprises aluminum silicon oxynitride or aluminum silicon nitride. In another embodiment, the nitridation process may be a rapid thermal nitridation (RTN) processor a plasma nitridation process using nitrogen gas or ammonia gas. In another embodiment, the high-k dielectric film comprises a material selected from the group consisting of aluminum oxide ($Al_2O_3$), hafnium oxide ($HfO_2$), tantalum oxide ($Ta_2O_5$), lanthanum oxide ($La_2O_3$), zirconium oxide ($ZrO_2$), titanium oxide ($TiO_2$), niobium oxide ($Nb_2O_5$), and combinations thereof.

In another aspect, the present invention is directed to a capacitor. The capacitor includes a lower electrode disposed on a substrate and a reaction preventing layer disposed on the lower electrode. The lower electrode comprises silicon, and the reaction preventing layer comprises metal silicon oxynitride. A high-k dielectric film is disposed on the reaction preventing layer. An upper electrode is disposed on the high-k dielectric film to cover the lower electrode.

In one embodiment, the metal silicon oxynitride is aluminum silicon oxynitride. In another embodiment, the high-k dielectric film may comprise a material selected from the group consisting of aluminum oxide ($Al_2O_3$), hafnium oxide ($HfO_2$), tantalum oxide ($Ta_2O_5$), lanthanum oxide ($La_2O_3$), zirconium oxide ($ZrO_2$), titanium oxide ($TiO_2$), niobium oxide ($Nb_2O_5$), and combinations thereof.

In another aspect, the present invention is directed to a capacitor. The capacitor includes a lower electrode disposed on a substrate and a reaction preventing layer disposed on the lower electrode. The lower electrode comprises silicon. The reaction preventing layer is formed by forming an assistance layer of metal oxide on the lower electrode and performing a nitridation process. The reaction preventing layer comprises metal silicon oxynitride. A high-k dielectric film is formed on the reaction preventing layer. An upper electrode is formed on the high-k dielectric film to cover the lower electrode.

In one embodiment, prior to formation of the assistance layer, a surface nitridation treatment is performed on an upper surface of the lower electrode. In another embodiment, the assistance layer comprises aluminum oxide, so that the reaction preventing layer comprises aluminum silicon oxynitride.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
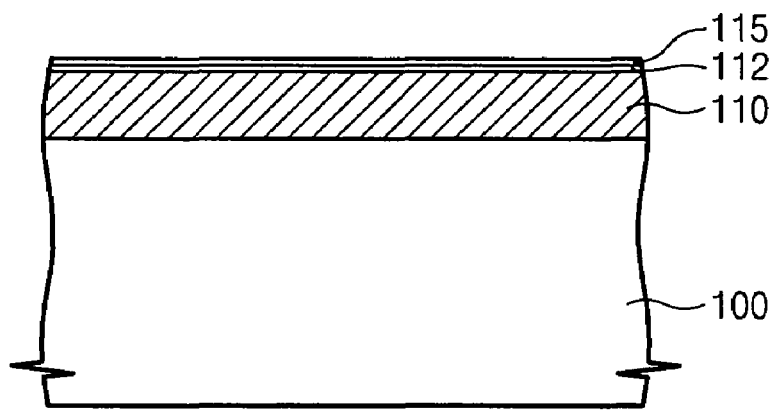
FIG. 1, FIG. 2, and FIG. 3 are cross-sectional views for illustrating a method of forming a capacitor according to the present invention.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the height of layers and regions are exaggerated for clarity. It will also be understood that when a layer is referred to as being "on" another layer or substrate, it can be directly on the other layer or substrate, or intervening layers may also be present. Like numbers refer to like elements throughout.

A method of forming a capacitor according to the present invention will now be described with reference to FIG. 1 through FIG. 3.

As illustrated in FIG. 1, a lower electrode 110 is formed on a substrate 100. The substrate 100 may be a silicon substrate on which an insulation layer is formed. The substrate 100 may optionally further include a plug that is connected to the silicon substrate through the insulation layer. The lower electrode 110 can be, for example, a flat-type electrode, a stack-type electrode or a cylindrical electrode. The lower electrode 110 comprises a conductive material, preferably, silicon, or optionally, doped polysilicon.

A surface nitridation treatment may be performed for the substrate 100 including the lower electrode 110. In a surface nitridation treatment, a surface layer 112 of $Si_xN_y$ is formed on an upper surface of the lower electrode 110. Due to the presence of the surface layer 112, a native oxide layer is not formed on the surface of the lower electrode 110. The surface nitrification treatment may be performed by rapid thermal nitridation (RTN) or plasma nitridation using nitrogen gas ($N_2$) or ammonia gas ($NH_3$).

An assistance layer 115 is formed on the substrate 100. The assistance layer 115 comprises metal oxide or metal nitride. Particularly, the assistance layer 115 can comprise aluminum oxide or aluminum nitride. Formation of the assistance layer 115 may be performed using chemical vapor deposition (CVD), atomic layer deposition (ALD) or sputtering.

In the case where the assistance layer 115 comprises aluminum oxide, the surface nitridation treatment is preferably performed to form the surface layer 112 before formation of the assistance layer 115. Due to the presence of the surface layer 112, a native oxide layer is not formed on the surface of the lower electrode 110 and the surface of the lower electrode 110 is not oxidized while forming the assistance layer 115 of aluminum oxide.

In the case where the assistance layer 115 comprises aluminum nitride, the surface nitridation treatment may be omitted before formation of the assistance layer 115. This is because when the assistance layer 115 of aluminum nitride is formed, the surface of the lower electrode 110 is not oxidized. However, in the present case where the assistance layer 115 comprises aluminum nitride, the surface nitridation treatment may of course be optionally performed to form the surface layer 112. Due to the presence of the surface layer 112, a native oxide layer is not formed on the surface of the lower electrode 110.

Figure 2:
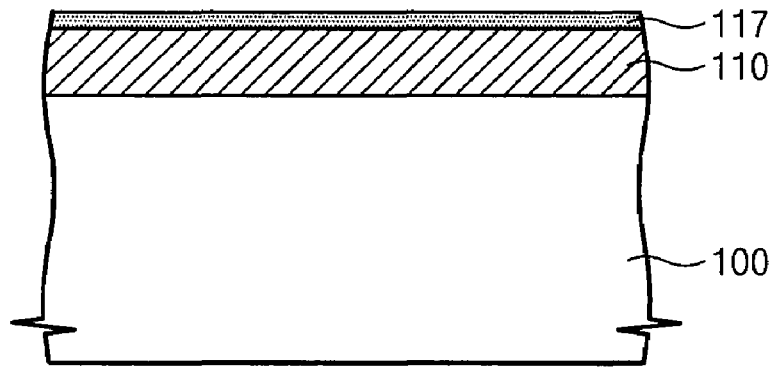

As illustrated in FIG. 2, a nitridation process is performed on the resulting structure, including the assistance layer 115. The nitridation process supplies activated nitrogen to resulting structure and supplies sufficient energy enough to allow elements (i.e., metal and oxide or metal and nitrogen) of the assistance layer 115 and silicon of the lower electrode 110 to react with each another. Thus, a reaction preventing layer 117 is formed on the lower electrode 110 by the nitridation process. The reaction preventing layer 117 comprises metal silicon oxynitride or metal silicon nitride.

In one example, the nitridation process is a rapid thermal nitridation (RTN) process or a plasma nitridation process using nitrogen and/or ammonia gas. The nitridation process is preferably performed at a temperature of 300-900 degrees centigrade. Specifically, the RTN process is preferably performed at a temperature of 600-900 degrees centigrade, and the plasma nitridation process is preferably performed at a temperature of 300-600 degrees centigrade.

In the case where the assistance layer 115 comprises metal oxide, the reaction preventing layer 117 comprises metal silicon oxynitride ($Al_wSi_xO_yN_z$). If the assistance layer 115 comprises metal nitride, the reaction preventing layer 117 comprises metal silicon nitride ($Al_xSi_yN_z$). Preferably, the assistance layer 115 comprises aluminum oxide or aluminum nitride, so that the reaction preventing layer 117 comprises aluminum silicon oxynitride or aluminum silicon nitride.

If the surface layer 112 is formed between the assistance layer 115 and the lower electrode 110, nitrogen substances supplied by the nitridation process, silicon substances of the lower electrode 110, the surface layer, and the assistance layer 115 react with one another to form the reaction preventing layer 117.

In the present invention, the reaction preventing layer 117 is not formed by conventional atomic layer deposition (ALD) using a catalyst for supplying the silicon source. Instead, silicon in the reaction preventing layer 117 is supplied from the lower electrode 110. As a result, the reaction preventing layer 117 formed according to the present invention exhibits superior characteristics.

Figure 3:
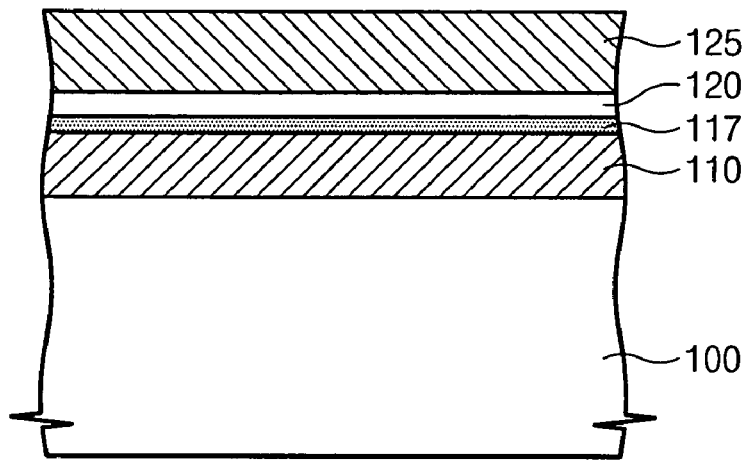

As illustrated in FIG. 3, a high-k dielectric film 120 is formed on the reaction preventing layer 117. The reaction preventing layer 117 fully suppresses a reaction between the high-k dielectric film 120 and the lower electrode 110.

The high-k dielectric film 120 comprises an insulation material having a higher dielectric constant than silicon nitride. The high-k dielectric film 120 may comprise a material selected from the group consisting of, for example, aluminum oxide ($Al_2O_3$), hafnium oxide ($HfO_2$), tantalum oxide ($Ta_2O_5$), lanthanum oxide ($La_2O_3$), zirconium oxide ($ZrO_2$), titanium oxide ($TiO_2$), niobium oxide ($Nb_2O_5$), and combinations thereof.

An upper electrode 125 is formed on the high-k dielectric film 120 to cover the lower electrode 110. Preferably, the upper electrode 125 comprises a conductive material that has a reduced reaction with the high-k dielectric film 120. The upper electrode 125 comprises, for example, conductive metal nitride such as titanium nitride or tantalum nitride or noble metal. The lower electrode 110, the reaction preventing layer 117, the high-k dielectric film 120, and the upper electrode constitute a capacitor.

According to the above-described method, the reaction preventing layer 117 is formed using the nitridation process after formation of the assistance layer 115. Namely, silicon in the reaction preventing layer 117 is supplied from the lower electrode 110, so that a catalyst for a silicon precursor according to the conventional ALD process is not required. Thus, the capacitor having a reaction preventing layer 117 formed according to the present invention offers the advantages of reduced leakage current and stable electrical properties.

Both metal silicon oxynitride and metal silicon nitride materials of the reaction preventing layer 117 enhance the leakage current characteristics of the capacitor. Particularly, the metal silicon oxynitride enhances the leakage current characteristics to a greater degree than the metal silicon nitride. This is because oxygen in the metal silicon oxynitride is coupled with trap states in the reaction preventing layer 117, trap states of an interface between the reaction preventing layer 117 and the lower electrode 110 and/or trap states of an interface between the reacting preventing layer 117 and the high-k dielectric film 120 to eliminate the effects of the trap states.

Figure 4:
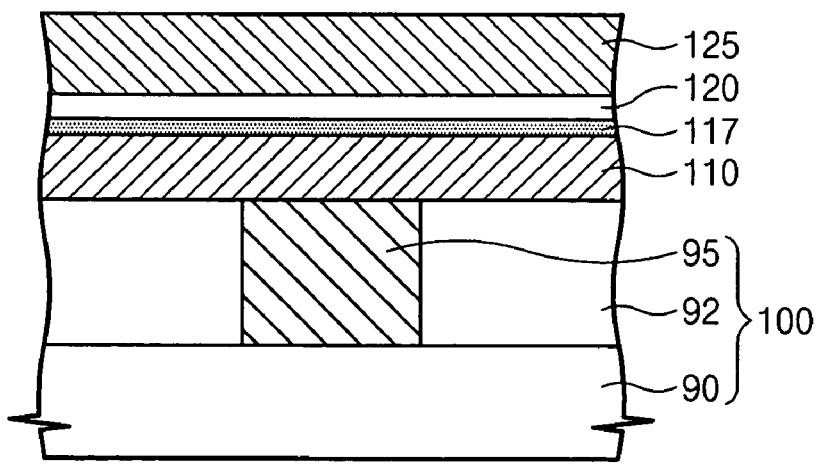
FIG. 4 is a cross-sectional view of a capacitor according to the present invention.

FIG. 4 is a cross-sectional view of a capacitor according to the present invention.

As illustrated in FIG. 4, an interlayer dielectric 92 is disposed on a silicon substrate 90. A plug 95 is disposed to be in contact with the silicon substrate through the interlayer dielectric 92. The silicon substrate 90, the interlayer dielectric 92, and the plug 95 constitute a substrate 100.

A lower electrode 110 is disposed on the interlayer dielectric 92. A high-k dielectric film 120 is disposed to cover the lower electrode 110. A reaction preventing layer 117 is interposed between the lower electrode 110 and the high-k dielectric 120. An upper electrode 125 is disposed on the high-k dielectric film 120 to cover the lower electrode 110.

The lower electrode 110 can, for example, be a flat-type electrode, a stack-type electrode or a cylindrical electrode. The lower electrode 110 comprises a conductive material, i.e., silicon, or optionally, doped polysilicon.

The reaction preventing layer 117 comprises a material that suppresses a reaction between the lower electrode 110 and the high-k dielectric film 120. Further, the reaction preventing layer 117 comprises a material that results in reduced leakage current of the capacitor. Preferably, the reaction preventing layer 117 comprises metal silicon oxynitride.

The metal silicon oxynitride material in the reaction prevention layer includes oxygen. The oxygen in the metal silicon oxynitride is coupled with trap states in the reaction preventing layer 117, trap states of an interface between the lower electrode 110 and the reacting preventing layer 117 and/or trap states of an interface between the reaction preventing layer 117 and the high-k dielectric film 120. A capacitor including the reaction preventing layer 117 of the present invention comprising metal silicon oxynitride reduces or eliminates the effects of such traps, which otherwise would operate as a leakage current path. For this reason, the present invention provides for excellent leakage current characteristics. A capacitor including a reaction prevention layer including metal silicon oxynitride offers superior leakage current characteristics as compared to a capacitor including reaction prevention layer including only metal silicon nitride. Preferably, the reaction preventing layer 117 comprises, for example, aluminum silicon oxynitride.

Preferably, the metal silicon oxynitride of the reaction preventing layer 117 is formed by providing an assistance layer (115 of FIG. 1) of metal oxide on the lower electrode and then performing a nitridation process, as described above with reference to FIG. 1 and FIG. 2. Thus, the reaction preventing layer 117 of the present invention comprising metal silicon oxynitride reduces impurities to enhance its characteristics. Further, the reaction preventing layer 117 is preferably formed by performing a surface nitridation treatment for an upper surface of the lower electrode 110 before forming the assistance layer. Due to the surface nitridation treatment, the lower electrode 110 is not oxidized (the surface of the lower electrode 110 is not oxidized during formation of a native oxide layer and/or the assistance layer 115). Preferably, the assistance layer 115 comprises aluminum oxide, and therefore the reaction preventing layer 117 comprises aluminum silicon oxynitride.

The high-k dielectric film 120 comprises an insulation material having a higher dielectric constant than silicon nitride. Preferably, the high-k dielectric film 120 is formed of a material selected from the group consisting of, for example, aluminum oxide ($Al_2O_3$), hafnium oxide ($HfO_2$), tantalum oxide ($Ta_2O_5$), lanthanum oxide ($La_2O_3$), zirconium oxide ($ZrO_2$), titanium oxide ($TiO_2$), niobium oxide ($Nb_2O_5$), and combinations thereof.

The upper electrode 125 comprises a conductive material. Particularly, the upper electrode 125 comprises a conductive material that has reduced reaction with the high-k dielectric film 125. The upper electrode 125 comprises, for example, conductive metal nitride such as titanium nitride or tantalum nitride or noble metal.

According to the present invention, an assistance layer is formed on a lower electrode, and a nitridation process is performed to form a reaction preventing layer. Since silicon in the reaction preventing layer is supplied from the lower electrode, characteristics of the reaction preventing layer are not degraded.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of forming a capacitor, comprising:
   forming a lower electrode on a substrate, the lower electrode comprising silicon;
   forming an assistance layer on the lower electrode, the assistance layer comprising metal oxide or metal nitride;
   performing a nitridation process to enable the silicon of the lower electrode, the assistance layer, and nitrogen supplied by the nitridation process to react with one another to form a reaction preventing layer, the reaction preventing layer comprising metal silicon oxynitride or metal silicon nitride;

forming a high-k dielectric film on the reaction preventing layer; and forming an upper electrode on the high-k dielectric film to cover the lower electrode.

2. The method as recited in claim 1, before formation of the assistance layer, further comprising performing a surface nitridation treatment on an upper surface of the lower electrode.

3. The method as recited in claim 1, wherein the assistance layer comprises aluminum oxide or aluminum nitride, so that the reaction preventing layer comprises aluminum silicon oxynitride or aluminum silicon nitride.

4. The method as recited in claim 1, wherein the nitridation process is a rapid thermal nitridation (RTN) process or a plasma nitridation process using nitrogen gas or ammonia gas.

5. The method as recited in claim 1, wherein the high-k dielectric film comprises a material selected from the group consisting of aluminum oxide ($Al_2O_3$), hafnium oxide ($HfO_2$), tantalum oxide ($Ta_2O_5$), lanthanum oxide ($La_2O_3$), zirconium oxide ($ZrO_2$), titanium oxide ($TiO_2$), niobium oxide ($Nb_2O_5$), and combinations thereof.

6. A capacitor comprising:
    a lower electrode disposed on a substrate, the lower electrode comprising silicon;
    a reaction preventing layer disposed on the lower electrode, the reaction preventing layer comprising metal silicon oxynitride, wherein the lower electrode between the substrate and the reaction preventing layer comprises silicon, and supplies the silicon to the reaction preventing layer;
    a high-k dielectric film disposed on the reaction preventing layer; and
    an upper electrode disposed on the high-k dielectric film to cover the lower electrode.

7. The capacitor as recited in claim 6, wherein the metal silicon oxynitride is aluminum silicon oxynitride.

8. The capacitor as recited in claim 6, wherein the high-k dielectric film comprises a material selected from the group consisting of aluminum oxide ($Al_2O_3$), hafnium oxide ($HfO_2$), tantalum oxide ($Ta_2O_5$), lanthanum oxide ($La_2O_3$), zirconium oxide ($ZrO_2$), titanium oxide ($TiO_2$), niobium oxide ($Nb_2O_5$), and combinations thereof.

9. A capacitor comprising:
    a lower electrode disposed on a substrate, the lower electrode comprising silicon,
    a reaction preventing layer disposed on the lower electrode, the reaction preventing layer being formed by forming an assistance layer on the lower electrode and performing a nitridation process, the reaction preventing layer comprising metal silicon oxynitride, wherein the lower electrode between the substrate and the reaction preventing layer comprises silicon, and supplies the silicon to the reaction preventing layer;
    a high-k dielectric film disposed on the reaction preventing layer; and
    an upper electrode disposed on the high-k dielectric film to cover the lower electrode.

10. The capacitor as recited in claim 9, wherein the reaction preventing layer is formed by further performing a surface nitridation treatment on an upper surface of the lower electrode before formation of the assistance layer.

11. The capacitor as recited in claim 9, wherein the assistance layer comprises aluminum oxide, so that the reaction preventing layer comprises aluminum silicon oxynitride.

12. A capacitor comprising:
    a lower electrode disposed on a substrate, the lower electrode comprising silicon;
    a reaction preventing layer disposed on the lower electrode, the reaction preventing layer comprising metal silicon oxynitride, wherein the metal silicon oxynitride is aluminum silicon oxynitride;
    a high-k dielectric film disposed on the reaction preventing layer; and
    an upper electrode disposed on the high-k dielectric film to cover the lower electrode.

13. A capacitor comprising:
    a lower electrode disposed on a substrate, the lower electrode comprising silicon,
    a reaction preventing layer disposed on the lower electrode, the reaction preventing layer being formed by forming an assistance layer on the lower electrode and performing a nitridation process, the reaction preventing layer comprising metal silicon oxynitride, wherein the assistance layer comprises aluminum oxide, so that the reaction preventing layer comprises aluminum silicon oxynitride;
    a high-k dielectric film disposed on the reaction preventing layer; and
    an upper electrode disposed on the high-k dielectric film to cover the lower electrode.

* * * * *